(12) United States Patent
Roh et al.

(10) Patent No.: US 7,977,177 B2
(45) Date of Patent: Jul. 12, 2011

(54) METHODS OF FORMING NANO-DEVICES USING NANOSTRUCTURES HAVING SELF-ASSEMBLY CHARACTERISTICS

(75) Inventors: Yonghan Roh, Seongnam-si (KR); Kyoungseob Kim, Daegu (KR); Seokwon Jeong, Suwon-si (KR); Hyungjin Kim, Suwon-si (KR); Sungha Park, Suwon-si (KR)

(73) Assignee: Sungkyunkwan University Foundation for Corporate Collaboration, Suwon-si, Gyeonggi-do (KR)

( * ) Notice: Subject to any disclaimer, the term of this patent is extended or adjusted under 35 U.S.C. 154(b) by 150 days.

(21) Appl. No.: 12/330,898

(22) Filed: Dec. 9, 2008

(65) Prior Publication Data

US 2010/0093160 A1 Apr. 15, 2010

(30) Foreign Application Priority Data

Oct. 9, 2008 (KR) .................. 10-2008-0098992

(51) Int. Cl.
*H01L 21/336* (2006.01)

(52) U.S. Cl. .. 438/197; 438/585; 438/299; 257/E21.346
(58) Field of Classification Search .................. 438/197, 438/585, 299, 301; 257/E21.346
See application file for complete search history.

(56) References Cited

U.S. PATENT DOCUMENTS

| 6,255,469 | B1 | 7/2001 | Seeman et al. |
| 6,946,675 | B2 | 9/2005 | Braun et al. |
| 2007/0117109 | A1 | 5/2007 | Rothemund |
| 2010/0093160 | A1* | 4/2010 | Roh et al. .................. 438/514 |

* cited by examiner

*Primary Examiner* — Jack Chen
(74) *Attorney, Agent, or Firm* — Hamre, Schumann, Mueller & Larson, P.C.

(57) ABSTRACT

Provided are methods of forming nano-devices. One of the methods includes forming a nano-scale self-assembly material layer on a substrate formed of at least one layer, forming a mask layer on the self-assembly material layer, performing a surface treatment process on the substrate using the mask layer as a mask, and removing the self-assembly material layer. Accordingly, it is possible to fabricate nano-devices through a nano-scale substrate patterning process, ion implantation process and etching process, without using a light source.

8 Claims, 9 Drawing Sheets

[Fig.1]
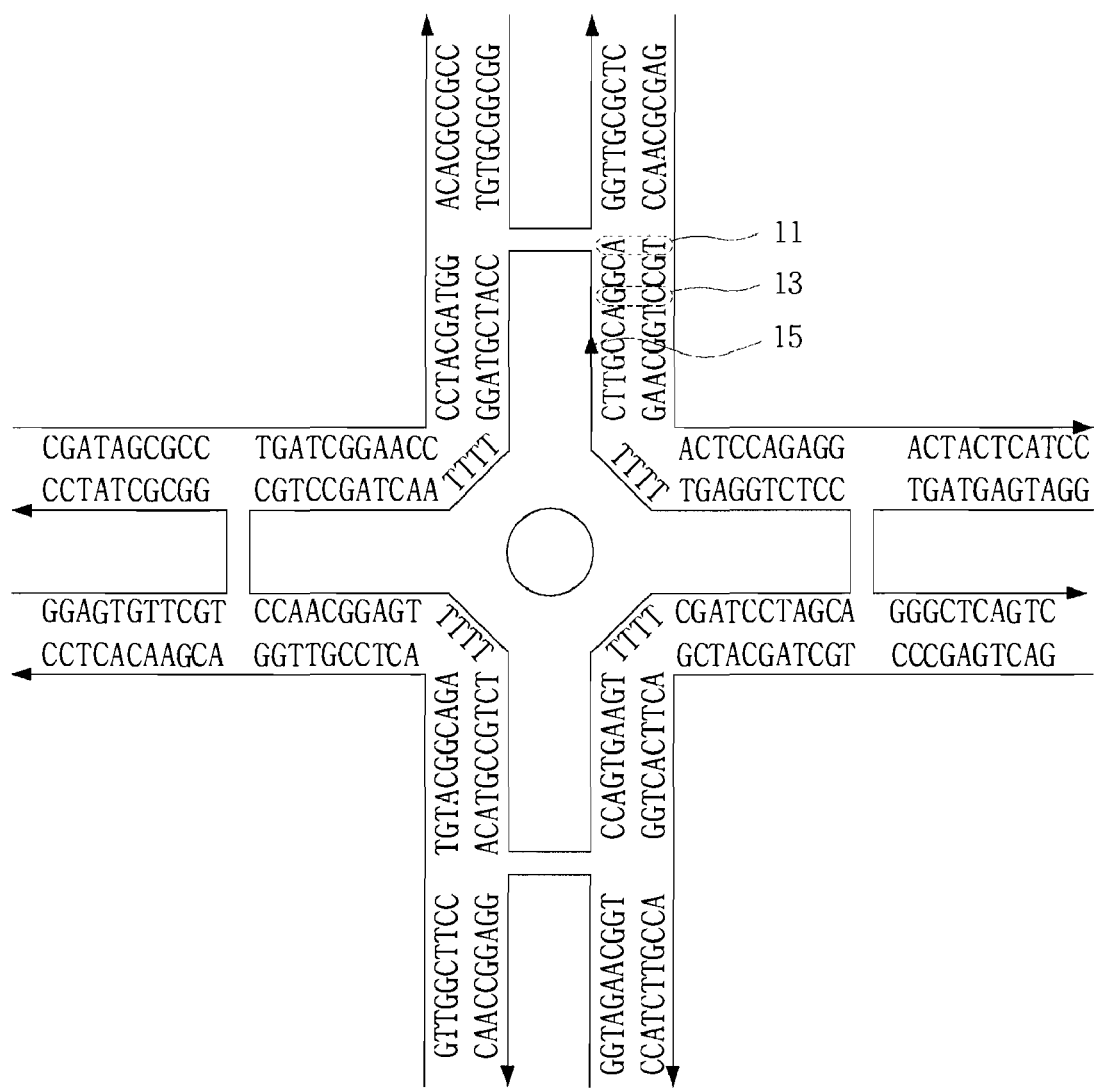

METHODS OF FORMING NANO-DEVICES USING NANOSTRUCTURES HAVING SELF-ASSEMBLY CHARACTERISTICS

CROSS-REFERENCE TO RELATED APPLICATION

This application claims the benefit of Korean Patent Application No. 2008-0098992, filed Oct. 9, 2008, the disclosure of which is hereby incorporated herein by reference in its entirety.

BACKGROUND OF THE INVENTION

1. Field of the Invention

The present invention relates to methods of forming nano-devices, and more particularly, to methods of forming nano-devices using nanostructures having self-assembly characteristics.

2. Description of the Related Art

In general, as semiconductor devices are miniaturized and rendered multi-functional, their design rules also decrease. However, it is difficult to miniaturize semiconductor devices and improve their performance through conventional methods. Therefore, in order to miniaturize semiconductor devices, increase their response speed, and increase the amount of information they can process, nano technology is being applied to semiconductor device fabrication. Here, nano technology refers to technology in which composition, assembly, control, measurement, and/or properties of materials are examined in minute units of atomic or molecular scale requiring a precision of $10^{-9}$ m.

Examples of nano technology applied to semiconductor device fabrication include a method of forming a nano-scale inclined structure used in a liquid crystal display and/or a nano print template. In the structure forming method, a semiconductor wafer substrate may include at least one material layer. Photoresist is formed on the substrate, and then exposure and development processes are performed thereon. An anisotropic ion etching process is performed in a direction of largest relative structure inclination on the substrate to remove a non-protective material layer. The remained photoresist cap blocks at least one material layer region. As the ion etching process is performed, an inclined protection region of the material layer is exposed.

However, since the structure forming method includes forming a pattern on the photoresist through the exposure process, it may be difficult to reduce a minimum feature-size of the semiconductor devices due to wavelength limitation of a light source used in the exposure process. In order to solve these problems, next-generation exposure technologies using a short wavelength such as deep ultraviolet (UV), X-rays, or an e-beam, and patterning methods using polymer materials other than photoresist, have been researched.

As an example of nanometer-scale patterning technologies using a light source, a next-generation exposure technique of oxidizing aluminum to form anodized aluminum oxide (AAO) and forming a nanometer-scale pattern using the AAO as a mask has been proposed. In addition, there is also a technique of applying external energy such as an electron beam to form a nanometer-scale pattern on a substrate.

However, the nanometer-scale patterning techniques using a light source or an electron beam may complicate a manufacturing process and increase manufacturing cost of semiconductor devices.

Meanwhile, a technique of forming a nano-structure using a material having self-assembly characteristics like a deoxyribonucleoic acid (DNA) molecule is also being researched to reduce the minimum feature-size of semiconductor devices. For example, a DNA sequence can be changed using self-assembly characteristics, and a DNA nano-structure can be designed using the DNA sequence.

In order to make a nano-device using a DNA molecule, a technique of forming a nano-wire or a nano-electrode is needed. For example, a technique of replacing a metal particle and an ion on the basis of a DNA molecule is needed. Therefore, a nanometer-scale DNA-based nano-wire and a nano-electrode having a nanometer gap can be formed by replacement of a negative charge in a DNA molecular structure with a cation having a different polarity than the negative charge.

In addition, a technique of forming a nano-structure by depositing a thin layer using a two- or three-dimensional nano-structure, and a technique of changing a DNA molecular sequence having self-assembly characteristics to make a desired structure, depositing a thin film, and then transferring it onto a substrate at a desired position to form a nano-structure, are being developed.

However, in the techniques of forming a nano-structure using a two- or three-dimensional DNA nano-structure or by changing a DNA molecular sequence, control of the shape and position of the nano-structure is difficult, and a nano-device manufacturing process is complicated.

SUMMARY OF THE INVENTION

An object of the present invention provides methods of forming nano-devices that enable nano-scale precision control, even when a mask layer is formed without using a light source and a substrate is patterned using the mask layer.

Another object of the present invention provides methods of forming nano-devices that enable an ion implantation process or an etching process to be performed on a substrate in nano-scale without using an exposure process.

Yet another object of the present invention provides methods of forming nano-devices that enable reduction of the number of manufacturing processes and manufacturing cost, and improvement of integration density and device yield.

The present invention provides a method of forming a nano-device including: forming a nano-scale self-assembly material layer on a substrate formed of at least one layer; forming a mask layer on the self-assembly material layer; performing a surface treatment process on the substrate using the mask layer as a mask; and removing the self-assembly material layer.

In the nano-device forming method in accordance with the present invention, the surface treatment process may be an etching process or an ion implantation process.

In addition, the mask layer may include any one material selected from the group consisting of gold (Au), silver (Ag), silicon (Si), silicon dioxide ($SiO_2$), silicon nitride (SiN), iron (Fe), cadmium selenide (CdSe), carbon nano-tubes (CNTs), buckyballs, and graphine.

Further, the self-assembly material layer may include any one material selected from the group consisting of a DNA molecule, protein, a synthetic polymer, and a carbon-based material.

Furthermore, the carbon-based material may include any one material selected from the group consisting of carbon nano-tubes (CNTs), buckyballs, and graphine.

In addition, each of the DNA molecule and the protein may be removed by a heat treatment process or by an acidic solution, the synthetic polymer may be removed by a heat treatment process or by a chemical agent, and the carbon-based material may be removed by a chemical agent selectively removing a carbon series material.

The present invention also provides a method of forming a nano-device including: forming an insulating layer on a substrate having an active region; forming a conductive layer on the insulating layer; forming a self-assembly material layer on the conductive layer; sequentially patterning the conductive layer and the insulating layer using the self-assembly material layer as an etching mask to form a conductive layer pattern and an insulating layer pattern; and forming an ion implantation region on the substrate using the self-assembly material layer as an ion implantation mask.

In addition, the nano-device forming method may further include, after forming the ion implantation region, removing the self-assembly material layer and forming a spacer layer on sidewalls of the conductive layer pattern and the insulating layer pattern.

BRIEF DESCRIPTION OF THE DRAWINGS

The above and other objects, features and advantages of the present invention will be more apparent from the following detailed description taken in conjunction with the accompanying drawings, in which:

FIG. 1 is a diagram showing a method of forming a nano-structure using complimentary coupling characteristics between bases of DNA molecules in accordance with an exemplary embodiment of the present invention;

DETAILED DESCRIPTION OF EXEMPLARY EMBODIMENTS

Hereinafter, exemplary embodiments of the present invention will be described with reference to the accompanying drawings. First, a method of forming a nano-structure that can be bonded to a mask layer using a DNA molecule having self-assembly characteristics will be described below.

Figure 2A:
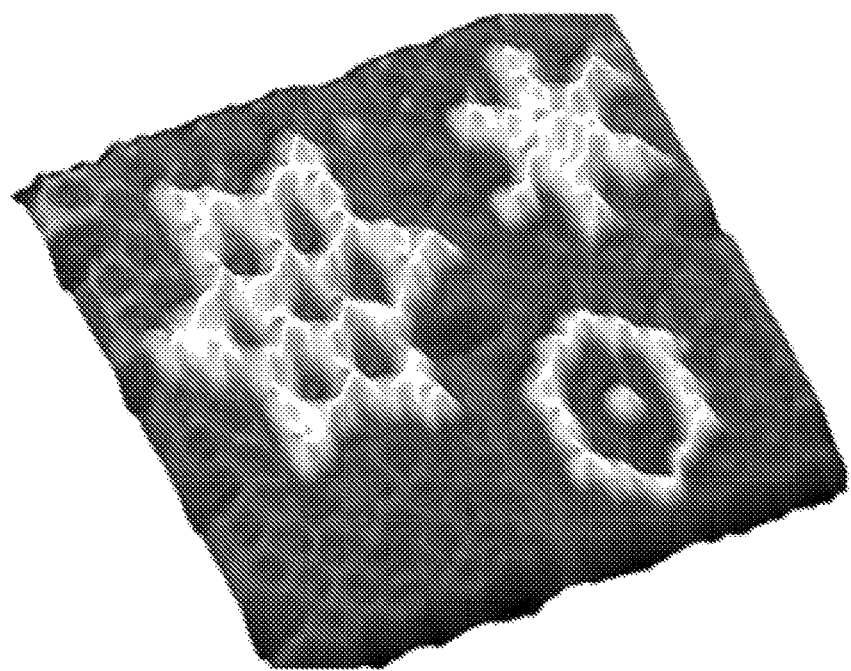
FIGS. 2A to 2C are atomic force microscopic (AFM) images of DNA nano-structures formed by the method of FIG. 1.
Figure 2B:
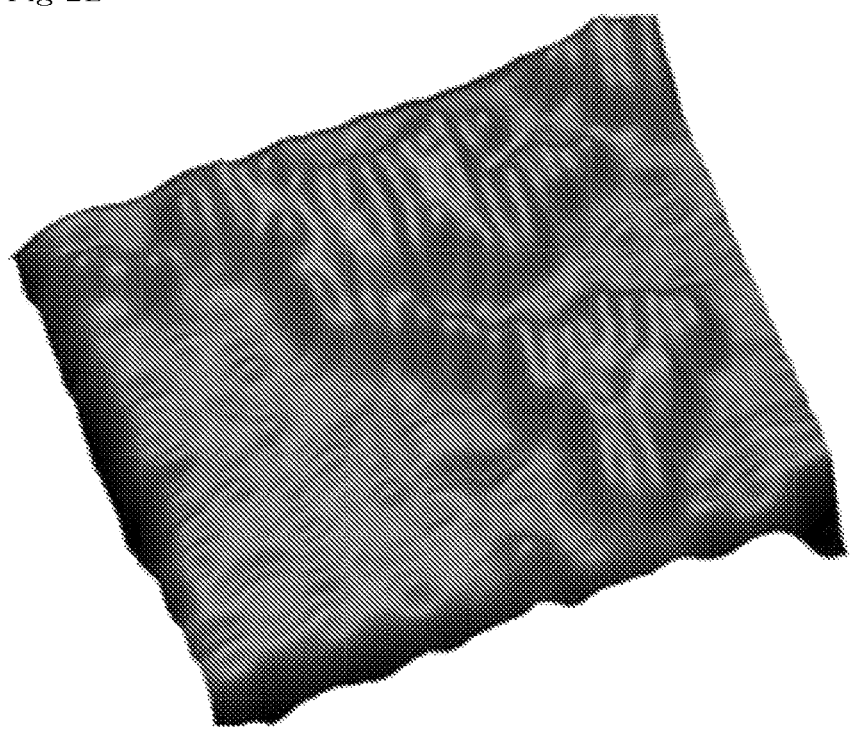
Figure 2C:
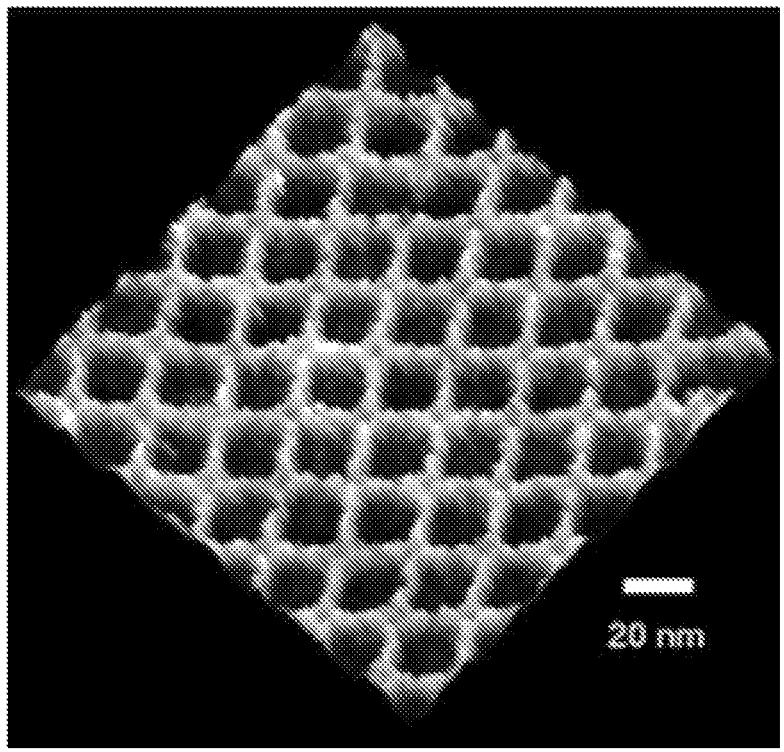

FIG. 1 is a diagram showing a method of forming a nano-structure using complimentary coupling characteristics between bases of DNA molecules in accordance with an exemplary embodiment of the present invention, and FIGS. 2A to 2C are atomic force microscopic (AFM) images of DNA nano-structures formed by the method of FIG. 1.

As shown in FIG. 1, a nanometer-sized DNA molecule has four different bases: adenine (A), thymine (T), guanine (G), and cytosine (C). In this case, as designated by reference numeral 11, A and T are bonded to each other through dual hydrogen bonding, and as designated by reference numeral 13, G and C are bonded to each other through triple hydrogen bonding. Therefore, the DNA molecule is replicated through complimentary bonding between A and T, and G and C. Eventually, when DNA strands whose sequences are changed are attached to each other using DNA molecular characteristics, the DNA molecule can be replicated in an arrow direction 15 by self-assembly characteristics.

As shown in FIGS. 2A to 2C, various nano-structures using self-assembly characteristics of the DNA molecule can be formed. Such technologies are disclosed in U.S. Pat. No. 6,946,675, entitled "MICROELECTRONIC COMPONENTS AND ELECTRONIC NETWORKS COMPRISING DNA," issued to Erez Braun, et al., on Sep. 20, 2005; U.S. Pat. No. 6,255,469, entitled "PERIODIC TWO AND THREE DIMENSIONAL NUCLEIC ACID STRUCTURES," issued to Nadrian Seeman, et al., on Jun. 3, 2001; and U.S. Patent Publication No. 2007/0117109, entitled "NANOSTRUCTURES, METHODS OF MAKING AND USING THE SAME," filed by Paul W. K. Rothermund and published on May 24, 2007. Detailed descriptions of these technologies will be omitted.

A process of etching a nano-device using a nano-structure having self-assembly characteristics in accordance with an exemplary embodiment of the present invention will be described below.

Figure 3A:
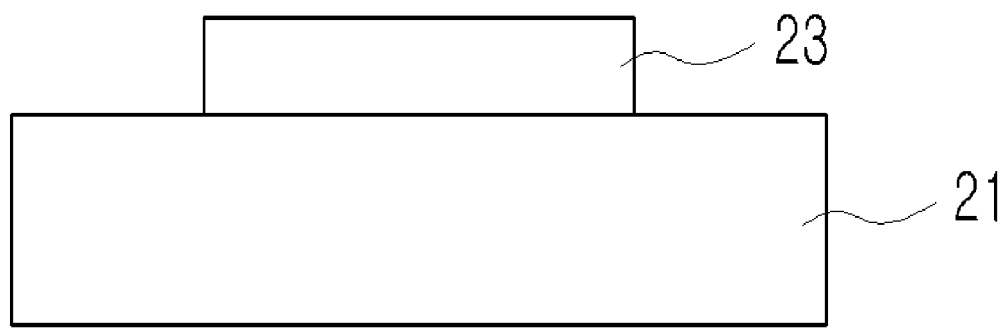
FIGS. 3A to 3D are diagrams showing etching processes using a nano-structure in accordance with an exemplary embodiment of the present invention.
Figure 3B:
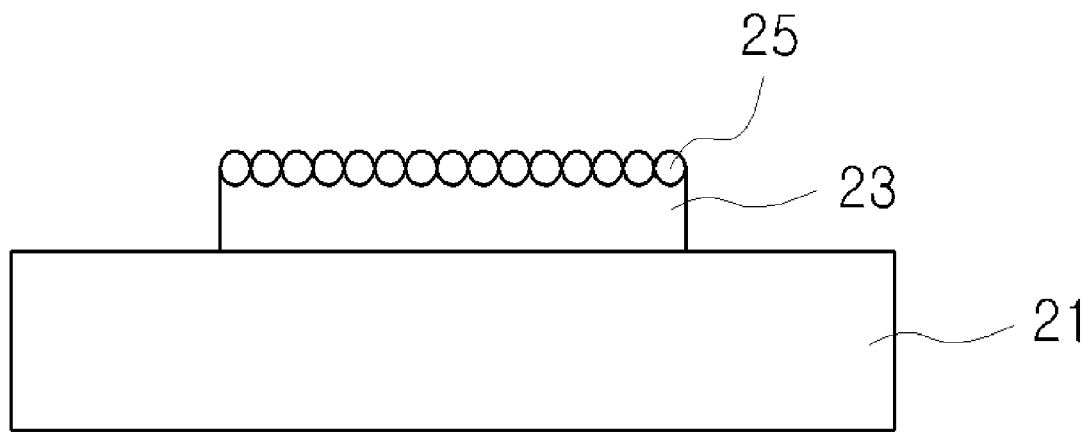
Figure 3C:
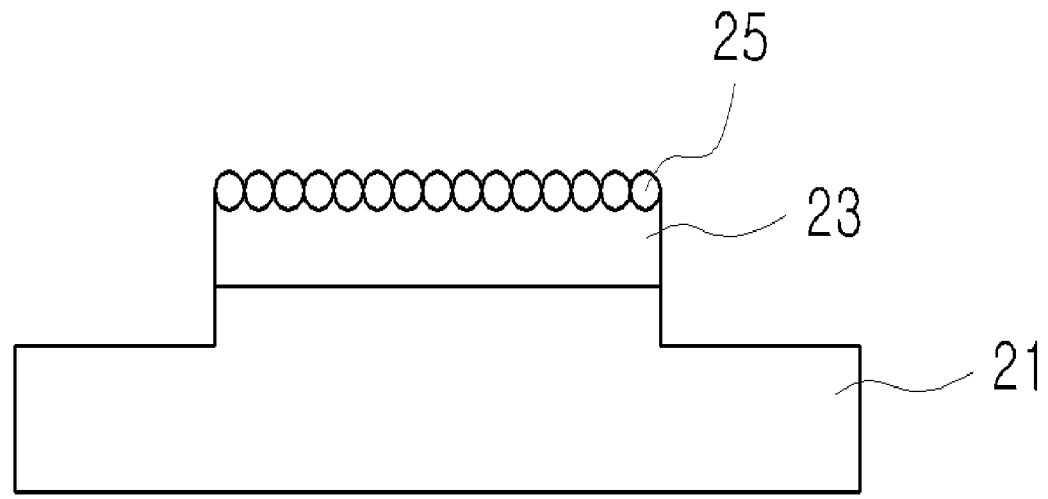
Figure 3D:
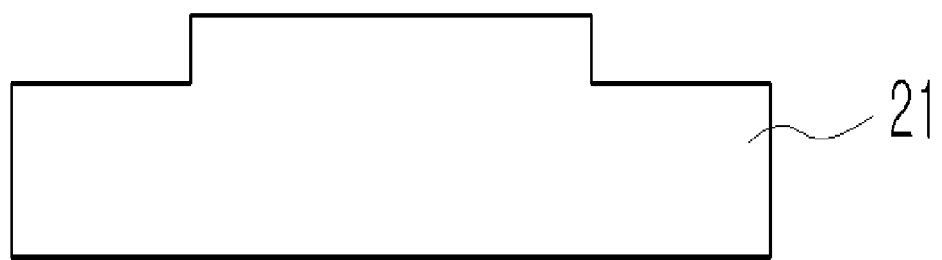
Figure 4:
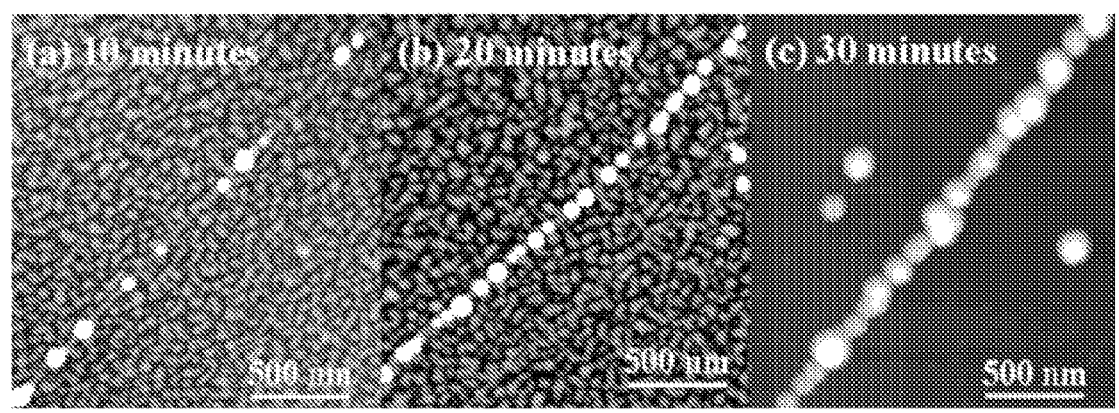
FIG. 4 is an AFM image of a nano-wire formed on a DNA nano-structure in accordance with an exemplary embodiment of the present invention.

FIGS. 3A to 3D are diagrams showing etching processes using a nano-structure in accordance with an exemplary embodiment of the present invention, and FIG. 4 is an AFM image of a nano-wire formed on a DNA nano-structure in accordance with an exemplary embodiment of the present invention.

As shown in FIG. 3A, a method of forming a nano-device in accordance with a first exemplary embodiment of the present invention includes forming a nano-scale self-assembly material layer 23 on a substrate 21 formed of at least one layer. As described above, the self-assembly material layer 23 may be formed of a DNA molecule using complimentarily bonded characteristics of four different bases. That is, the self-assembly material layer 23 may be patterned in nano-scale on the substrate 21 using self-assembly characteristics.

In addition, the self-assembly material layer 23 may be formed of any one material selected from the group consisting of protein, a synthetic polymer, and a carbon-based material. In this case, the protein includes functional protein such as apoferritin containing an insulating particle. In addition, the carbon-based material may be formed of any one material selected from the group consisting of carbon nano-tubes (CNTs), buckyballs, and graphine.

Each of the protein, the synthetic polymer and the carbon-based material is nano-patterned in a different manner than the DNA molecule formed through complimentary coupling. More specifically, each of the protein, the synthetic polymer and the carbon-based material may be patterned in nano-scale according to a specific profile in specific growth conditions and environments. For example, block copolymers, a type of synthetic polymer in which at least two different polymer chains are forcibly connected through chemical bonding, may be deposited on a substrate and then nano-patterned in a desired shape like a nano-hole or a nano-wire according to characteristics of a heat treatment process and an applied electric field.

As shown in FIGS. 3B and 4, a mask layer 25 formed of nano-particles is formed on the self-assembly material layer 23. The surface of the mask layer 25 is rendered functional to be attached to the self-assembly material layer 23. Describing the self-assembly material layer 23 formed of a DNA molecule more specifically, as is well known, a sugar-phosphate backbone of the self-assembly material layer formed of a DNA molecule has a negative electric polarity (−). Therefore, an organic monolayer having a positive electric polarity (+) is formed on each surface of nano-particles constituting the mask layer 25 through a chemical method. As a result, the mask layer 25 represents a positive electric polarity (+) through chemical modification. Through the above method, a surface charge amount of the mask layer 25 can be adjusted, and the mask layer 25 can be bonded to the nano-patterned self-assembly material layer 23 by electrical attraction. However, there may be various methods of chemically modifying each surface of nano-particles constituting the mask layer 25, and the chosen method may depend on the material constituting the mask layer 25.

FIG. 4 illustrates AFM photographs showing a gold (Au) nano-wire chemically modified and attached to a DNA nano-structure formed on a substrate. Accordingly, the mask layer 25 may be formed of nano-particles such as semiconductor materials, insulating materials, or magnetic materials and attached to the DNA nano-structure. The mask layer 25 may be formed of any one material selected from the group consisting of gold (Au), silver (Ag), silicon (Si), silicon dioxide (SiO2), silicon nitride (SiN), iron (Fe), cadmium selenide (CdSe), carbon nano-tubes (CNTs), buckyballs, and graphine.

Meanwhile, when the self-assembly material layer 23 is formed of spherical protein, there is a space in which nano-particles can be captured in the spherical protein, and the space can be opened/closed depending on heat treatment and various conditions. Thus, the self-assembly material layer 23 may capture the nano-particles constituting the mask layer 25 in the space. In addition, when the mask layer 25 is formed of a synthetic polymer or a carbon-based material including carbon nano-tubes, the nano-particles constituting the mask layer 25 can be attached to the self-assembly material layer 23 by electrical attraction through chemical modification. Therefore, the mask layer 25 is formed to have a nano-scale pattern using self-assembly characteristics of the self-assembly material layer 23, without using an exposure process.

As shown in FIGS. 3C and 3D, an etching process such as a dry or wet etching process is performed on the substrate 21 having the mask layer 25. Thus, the mask layer 25 may function as a mask or an etch stopper. Next, the self-assembly material layer 23 and the mask layer 25 are removed, either simultaneously or separately.

Meanwhile, when the self-assembly material layer 23 is formed of DNA nano-structures or protein, the self-assembly material layer 23 may be removed by a heat treatment process in a temperature range of about 90° C. to about 200° C. or by an acidic solution. In addition, when the self-assembly material layer 23 is formed of a synthetic polymer, it may be removed by a heat treatment process or by a chemical agent. When the self-assembly material layer 23 is formed of a carbon-based material including carbon nano-tubes, it may be removed a chemical agent that can selectively remove a carbon series material.

Figure 5A:
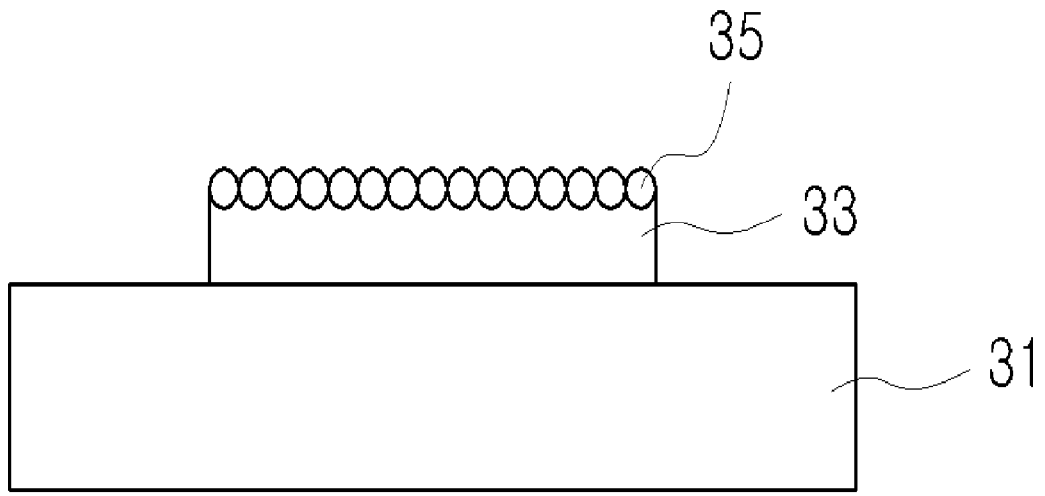
FIGS. 5A to 5C are diagrams showing ion implantation processes using a nano-structure in accordance with another exemplary embodiment of the present invention.
Figure 5B:
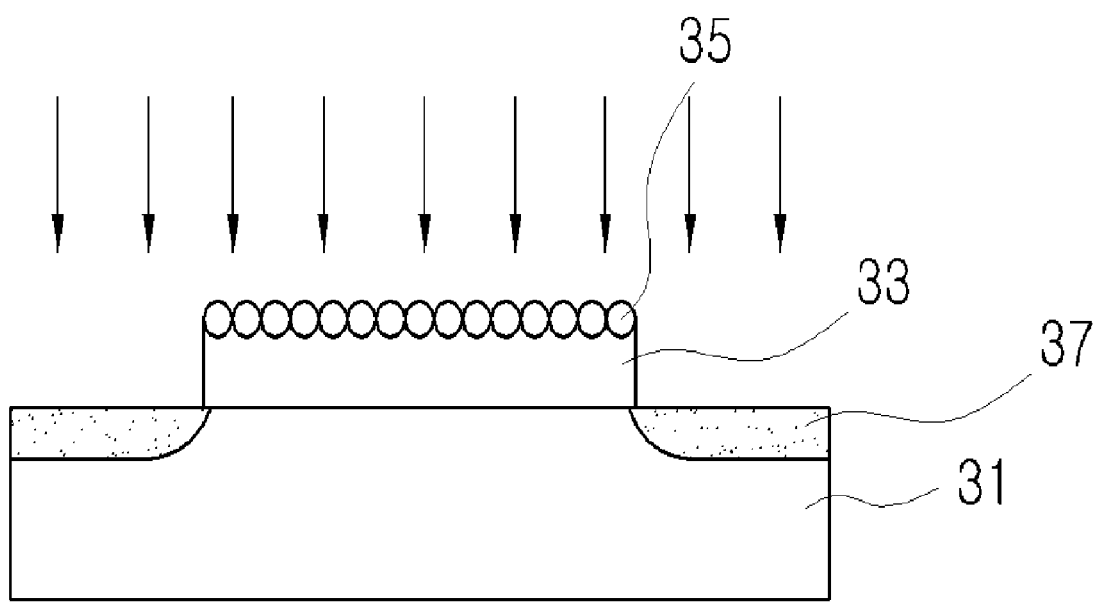
Figure 5C:
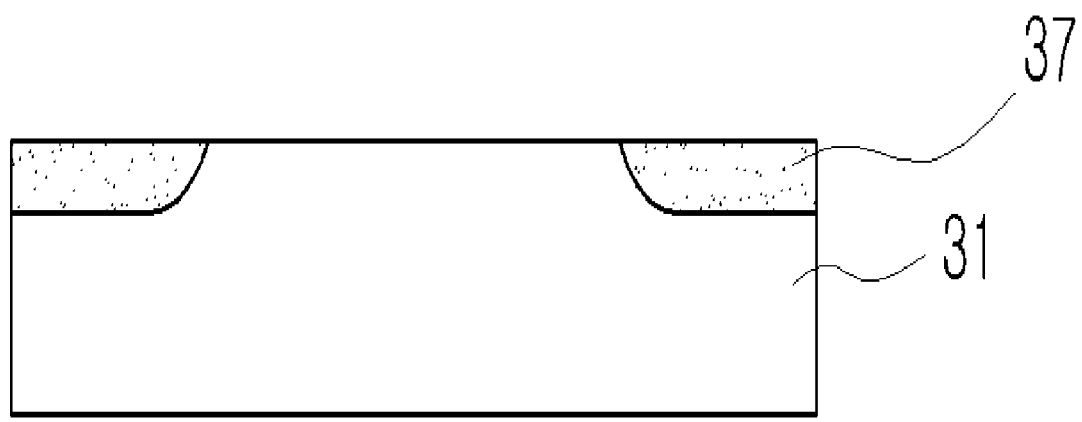
Figure 6A:
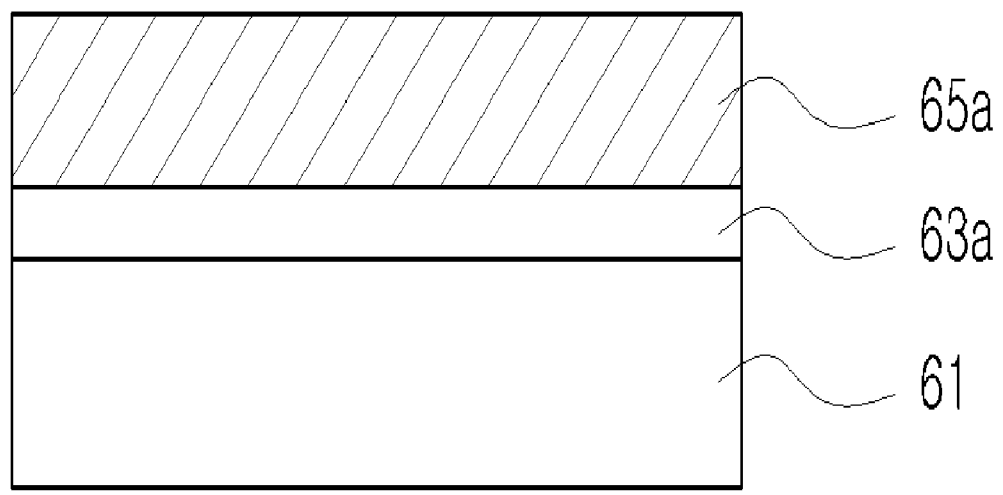
FIGS. 6A to 6E are diagrams showing a method of forming a transistor using a nano-structure in accordance with yet another exemplary embodiment of the present invention.
Figure 6B:
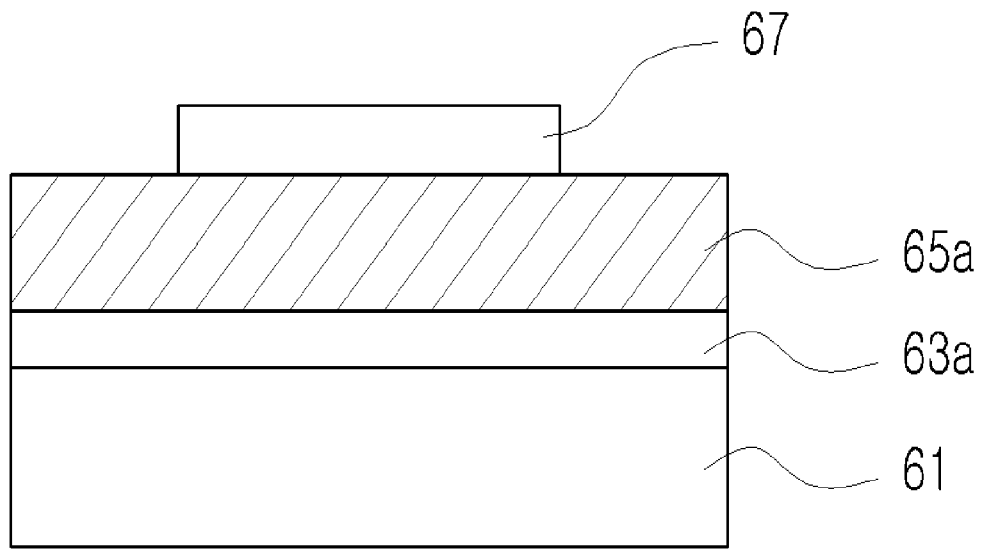
Figure 6C:
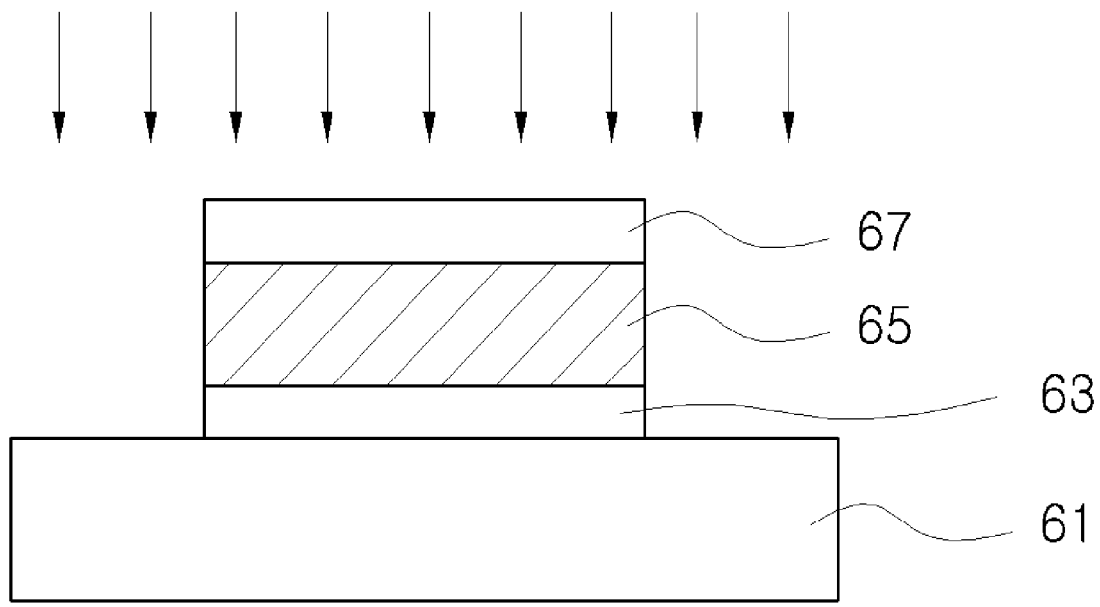
Figure 6D:
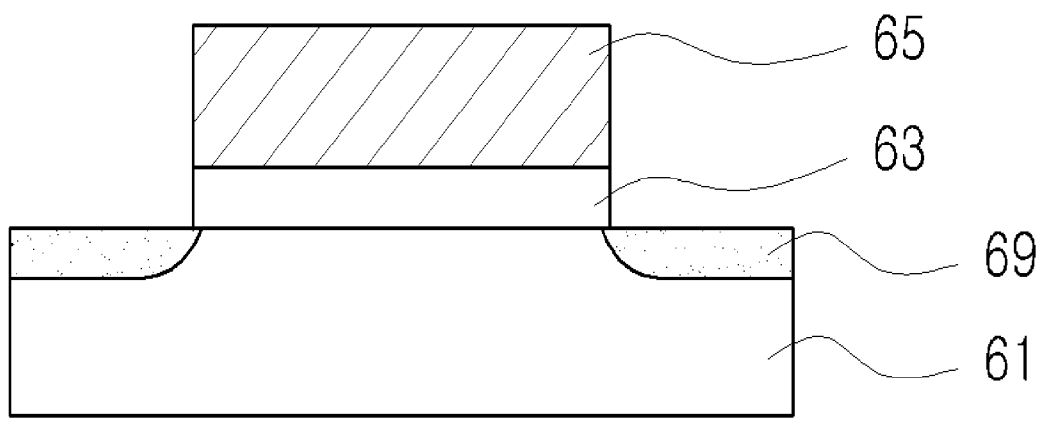
Figure 6E:
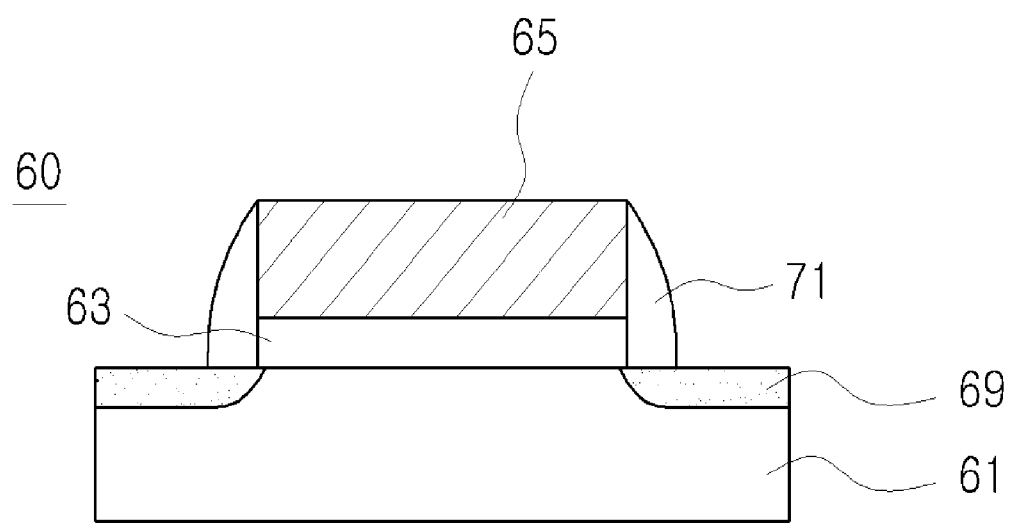

Next, an ion implantation process of a nano-device in accordance with another exemplary embodiment of the present invention will be described. FIGS. 5A to 5C are diagrams showing ion implantation processes using a nano-structure in accordance with another exemplary embodiment of the present invention.

As shown in FIGS. 5A to 5C, a nano-scale self-assembly material layer 33 and mask layer 35 are sequentially formed on a substrate 31 formed of at least one layer. An ion implantation process is performed on the entire surface of the substrate 31 using the mask layer 35 as an ion implantation mask to form an ion implantation layer 37. The self-assembly material layer 33 and the mask layer 35 are formed of the above-mentioned material, whose description will not be repeated.

Eventually, a nano-scale mask layer in accordance with an exemplary embodiment of the present invention may function as a mask or an etch stopper during a surface treatment process such as an etching process or an ion implantation process.

Next, a method of forming a transistor using a nano-structure in accordance with yet another exemplary embodiment of the present invention will be described. While a method of forming a semiconductor device in accordance with the present invention will be described, the present invention is not limited thereto; the inventive method may be used to manufacture any nano-device using any nano-structure having self-assembly characteristics. FIGS. 6A to 6E are diagrams showing a method of forming a transistor using a nano-structure in accordance with yet another exemplary embodiment of the present invention.

As shown in FIGS. 6A to 6E, an insulating layer 63a and a conductive layer 65a are sequentially formed on a substrate 61 having an active region to form a transistor 60 in accordance with an exemplary embodiment of the present invention. The conductive layer 65a may be formed of polysilicon or metal. A self-assembly material layer 67 formed of any one material selected from the group consisting of a DNA molecule, protein, a synthetic polymer, and a carbon-based material is formed on the conductive layer 65a. The conductive layer 65a and the insulating layer 63a are sequentially patterned using the self-assembly material layer 67 as an etching mask to form a conductive layer pattern 65 and an insulating layer pattern 63. An ion implantation region 69 is formed on the substrate 61 using the self-assembly material layer 67 as an ion implantation mask. After forming the ion implantation region 69, the self-assembly material layer 67 is removed.

When the self-assembly material layer 67 is formed of DNA nano-structures or protein, the self-assembly material layer 67 may be removed by a heat treatment process performed in a temperature range of about 90° C. to about 200° C. or by an acidic solution. In addition, when the self-assembly material layer 67 is formed of a synthetic polymer, the self-assembly material layer 67 may be removed by a heat treatment process or by a chemical agent. When the self-assembly material layer 67 is formed of a carbon-based material, the self-assembly material layer 67 may be removed by a chemical agent that can selectively remove a carbon series material.

A spacer layer 71 is formed on sidewalls of the conductive layer pattern 65 and the insulating layer pattern 63. Therefore, a nano-sized transistor 60 can be fabricated using the self-assembly material layer 67. In addition, the self-assembly material layer 67 may be used to fabricate a nano-sized interconnection on an interlayer insulating layer, for example, a nano-sized bit line or metal interconnection. Further, the self-assembly material layer 67 may be used for cell patterning of a nano-sized fin field effect transistor (finFET) or phase-change random access memory (PRAM) device.

While the present invention has been described with reference to exemplary embodiments concerning fabrication of a semiconductor device, it will be clear to those of ordinary skill in the art to which the invention pertains that various modifications may be made to the described embodiments, such as applying them to fabrication of a nano-device using a nano-structure having self-assembly characteristics, without departing from the spirit and scope of the invention as defined by the appended claims and their equivalents.

In the drawings, the thickness of layers and regions are exaggerated for clarity. In addition, when a layer is described as being formed on another layer or substrate, the layer may be formed directly on the other layer or substrate, or a third layer may be interposed between them.

The methods of forming nano-devices in accordance with the present invention can be applied to fabrication of photonic crystal devices, magnetic devices, information recording media, solar cells, or semiconductor devices including nano-sized transistors. In addition, nano-structures having self-assembly characteristics can be applied to fabrication of nano-devices such as nano-actuators, nano-robots, and the like.

As can be seen from the foregoing, methods of forming nano-devices in accordance with the present invention make it possible to pattern a substrate in nano-scale using a nano-structure having self-assembly characteristics, without using a light source.

In addition, it is possible to perform an ion implantation process and an etching process in nano-scale by forming a mask layer on a substrate using a nano-structure, without using an exposure process.

Further, it is possible to reduce the number of manufacturing processes and manufacturing cost, and improve the integration density of semiconductor devices.

Furthermore, it is possible to improve yield of nano-devices using a nano-structure having self-assembly characteristics.

What is claimed is:

1. A method of forming a nano-device, comprising:
   forming an insulating layer on a substrate having an active region:
   forming a conductive layer on the insulating layer;
   forming a self-assembly material layer on the conductive layer;
   sequentially patterning the conductive layer and the insulating layer using the self-assembly material layer as an etching mask to form a conductive layer pattern and an insulating layer pattern; and
   forming an ion implantation region on the substrate using the self-assembly material layer as an ion implantation mask.

2. The method according to claim 1, wherein a mask layer containing nano particles is formed on the self-assembly material layer to be used as the etching mask or the ion implantation mask, and the mask layer comprises any one material selected from the group consisting of gold (Au), silver (Ag), silicon (Si), silicon dioxide ($SiO_2$), silicon nitride (SiN), iron (Fe), cadmium selenide (CdSe), carbon nano-tubes (CNTs), buckyballs, and graphine.

3. The method according to claim 1, wherein the self-assembly material layer comprises any one material selected from the group consisting of a DNA molecule, protein, a synthetic polymer, and a carbon-based material.

4. The method according to claim 3, wherein the carbon-based material comprises any one material selected from the group consisting of carbon nano-tubes (CNTs), buckyballs, and graphine.

5. The method according to claim 3, wherein each of the DNA molecule and the protein is removed by a heat treatment process or by an acidic solution, the synthetic polymer is removed by a heat treatment process or by a chemical agent, and the carbon-based material is removed by a chemical agent selectively removing a carbon series material.

6. The method according to claim 1, further comprising, after forming the ion implantation region, removing the self-assembly material layer and forming a spacer layer on sidewalls of the conductive layer pattern and the insulating layer pattern.

7. The method according to claim 6, wherein the self-assembly material layer comprises any one material selected from the group consisting of a DNA molecule, protein, a synthetic polymer, and a carbon-based material.

8. The method according to claim 7, wherein each of the DNA molecule and the protein is removed by a heat treatment process or by an acidic solution, the synthetic polymer is removed by a heat treatment process or by a chemical agent, and the carbon-based material is removed by a chemical agent selectively removing a carbon series material.

* * * * *